United States Patent [19]

Königer et al.

[11] Patent Number: 4,586,069
[45] Date of Patent: Apr. 29, 1986

[54] OPTO-ELECTRICAL DEVICE MADE OF SILICON FOR DETECTING INFRARED LIGHT

[75] Inventors: Max Königer, Munich; Gerhard Müller, Eglharting, both of Fed. Rep. of Germany

[73] Assignee: Messershmitt-Boelkow-Blohm Gesellschaft-mit-beschraenkter Haftung, Munich, Fed. Rep. of Germany

[21] Appl. No.: 529,491

[22] Filed: Sep. 6, 1983

[30] Foreign Application Priority Data

Sep. 14, 1982 [DE] Fed. Rep. of Germany ....... 3234096

[51] Int. Cl.$^4$ ................. H01L 27/14; H01L 31/00
[52] U.S. Cl. ........................ 357/30; 357/15
[58] Field of Search ................ 357/30, 15, 88

[56] References Cited

U.S. PATENT DOCUMENTS

| | | | |
|---|---|---|---|
| 4,040,078 | 8/1977 | Eckton et al. | 357/30 |
| 4,496,964 | 1/1985 | Tsubouchi et al. | 357/15 |
| 4,518,981 | 5/1985 | Schlupp | 357/15 |
| 4,524,374 | 6/1985 | Denda et al. | 357/15 |
| 4,544,939 | 10/1985 | Kosonocky et al. | 357/15 |

OTHER PUBLICATIONS

"Evaluation of a Schottky-Barrier IR-CCD Storing Mosaic Focal Plane" by B. Capone et al. in SPIE, 156 Modern Utilization of Infrared Technology IV (1978).
Platinum Silicide Schottky-Barrier IR-CCD Image Sensors by M. Kimata et al. in the Japanese Journal of Applied Physics, vol. 21, p. 231, (1982).
Fundamentals of Semiconductor Devices, by E. S. Yang, McGraw-Hill Book Company, 1978, p. 133.

Primary Examiner—William L. Sikes
Assistant Examiner—Robert E. Wise
Attorney, Agent, or Firm—W. G. Fasse; D. H. Kane, Jr.

[57] ABSTRACT

An infrared detector element of the Schottky-barrier type is constructed to have its sensitivity in the range of about 8 to 12 microns. For this purpose a silicon substrate (1) has a highly doped surface layer (3) of p$^+$-silicon with a doping density in the range of $5 \times 10^{18}$ to $5 \times 10^{19}$ (atoms per cm$^3$) and a thickness in the range of 50 to 200 Angstroms. On top of this layer (3) a metal layer (2) for example of platinum is deposited and partially alloyed into layer (3) to form PtSi. Such elements are arranged in arrays and may be combined with other detector elements having their sensitivity in other spectrum ranges, e.g., 3 to 5 microns and/or in the visible spectrum range.

6 Claims, 3 Drawing Figures

OPTO-ELECTRICAL DEVICE MADE OF SILICON FOR DETECTING INFRARED LIGHT

BACKGROUND OF THE INVENTION

The invention relates to an opto-electrical structural device or element made of silicon for detecting light in the wavelength band between 8 and 12 μm with a Schottky transition or junction of p-doped silicon and a metal having a prescribed work function or electron affinity.

Detectors made of semiconducting silicon play a very important role in the photodetection of light in the visible and near infrared range of the spectrum. The Si-detectors are constructed, for instance, in the form of pn-photodiodes, PIN-photocells, Schottky barrier cells or elements, or MOS cells. These Si-structural elements have a high quantum yield or efficiency in the visible and near infrared range. A further advantage of using Si is seen in that, due to the highly developed technology of this material, one may now produce one-dimensional lines as well as so-called two-dimensional arrays, which comprise a plurality of consistently or uniformly sensitive detectors, for instance 256×256 with dimensions of 25×25 μm (micrometer). Additionally, the signal-reading and further processing of the signals from the separate detector elements may be achieved by structural elements which are likewise integrated in the same silicon chip, which also comprises the detector elements. This method of construction is in a high state of development; solid state vidicons are already being produced based on silicon technologies.

The detection and imaging of light with wavelengths greater than 1 μm, especially in the spectral bands 3–5 μm and 8–12 μm, is of great interest. Semiconductors having small energy gaps matched to this spectral band are especially used for such detection. Such semiconductors are, for example, indium antimonide (InSb) and cadmium-mercury telluride (CdHgTe). Even though the crystal growth of these materials and the production of structural elements therefrom is considerably more difficult than with silicon, arrays with a relatively small number of detector elements have already been realized.

Furthermore, a certain success has been achieved in connection with a different type of silicon detector element which differs from the one described above, in that it has an infrared sensitivity in the range of 3–5μ. These prior art detectors take advantage of the effect of the so-called internal photo emission by means of a Schottky barrier. If contacts made of metal having an appropriate work function are applied to the front surface of suitably prepared silicon, then barriers result at the metal-silicon interface. These barriers are suitable for detecting infrared radiation in the range of 3–5 μm. The precious metals palladium and platinum have been proven to be especially suitable for this range of the IR-spectrum. With Pt and p-doped Si, barriers of 0.27 eV are obtained. Reference is made in this connection, for example, to an article: "Evaluation of a Schottky IR-CCD Staring Mosaic Focal Plane" by B. Capone et al in SPIE, 156 Modern Utilization of Infrared Technology IV (1978)", or to an article entitled "Platinum Silicide Schottky-Barrier IR-CCD Image Sensors" by M. Kimata et al in the Japanese Journal of Applied Physics, Vol. 21, Pg. 231, (1982)". These detector elements possess—compared to intrinsic semiconductor detectors—a small quantum yield or efficiency, however they may be produced with very great uniformity and are therefore well-suited to the production of larger arrays with many detector elements. Suitable structures, e.g., the well known CCD's (Charge Coupled Devices), may be integrated into the silicon for the signal-reading of the individual detector signals.

It is known from Schottky's works, see e.g., "Fundaments of Semiconductor Devices", by E. S. Yang, McGraw-Hill Book Company, 1978, pg. 133" that by applying an electrical field E to a metal/semiconductor contact a reduction of the existing barriers, corresponding to $$\Delta \phi = \sqrt{\frac{qE}{4\pi\epsilon\epsilon_{Si}}}$$

takes place, wherein: q=elemental charge, ϵ=absolute dielectric constant, and $\epsilon_{Si}$=relative dielectric constant of silicon. However, the required high field E is only achieved at the interface metal/semiconductor, if the semiconductor is very highly doped, e.g., higher than $10^{17}$ doping atoms per $cm^3$. Such a high doping leads to such a high reverse current flowing on the metal/semiconductor that the arrangement is totally unsuitable for use as a detector.

OBJECTS OF THE INVENTION

In view of the above it is the aim of the invention to achieve the following objects singly or in combination:

to produce a detector element or detector arrays of such elements of the above described Schottky-barrier type which have their sensitivity range in the longer-wave, so-called thermal infrared range, preferably of 8–12 μm;

to form such Schottky-barriers of the size $\phi=0.10$–$0.15$ eV for the mentioned sensitivity range; and to attain the desired barrier level while avoiding the problem resulting from the fact that it is not possible to achieve the desired barrier levels by applying metals to silicon, due to the fixed physically given work function or electron affinity of the metals and of the silicon.

SUMMARY OF THE INVENTION

Due to the emplacement or application according to the invention of an extremely thin doping layer having a controlled high doping concentration, into the otherwise slightly doped semiconductor directly at the interface between the metal and the semiconductor, an electrical field E is produced. This electric field provides the desired barrier while the good inverse characteristic (small inverse current) of the junction is simultaneously maintained.

According to the invention the required high field E is produced by means of the thin doping layer for producing a desired barrier height $\phi$ at the interface according to the above equation, while the slight doping of the remaining semiconductor volume determines the good inverse characteristics.

In the case that platinum and silicon are used, a barrier of $\phi=0.10$–$0.15$ eV, which detects infrared light in the range of 8–12 μm, is obtained if p-Si (10–50 Ωcm) is used and if platinum serves as the barrier metal. Before the application of the platinum by vapor deposition or sputtering, a 50–200 Å, preferably 100 Å, thin layer is formed in the p-Si at the metal-silicon interface over a definite surface area. This thin layer is strongly p+-doped with a doping concentration of $5 \times 10^{18} – 5 \times 10^{19}$ atoms per cm$^3$ by the implantation of trivalent elements, preferably boron.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
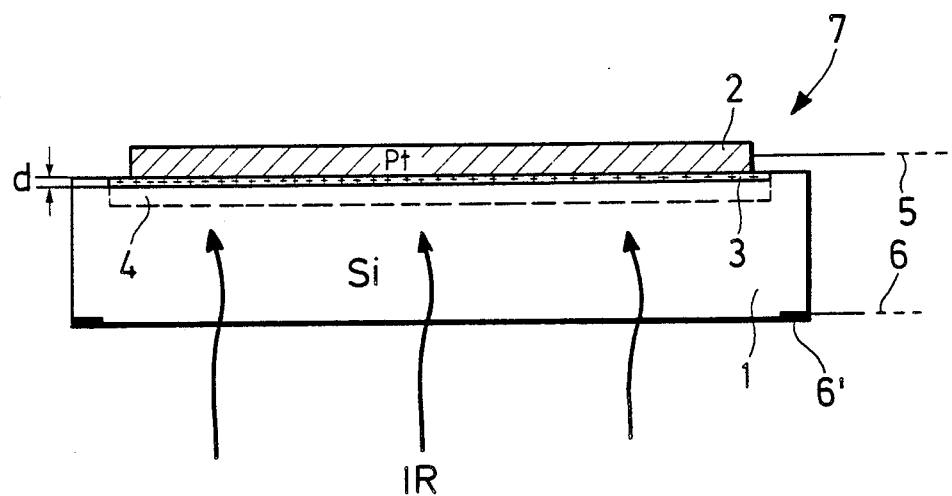
FIG. 1 is a side view partially in section of an infrared detector element according to the invention.

FIG. 1 shows a side view partially in section through an optoelectrical structural element or device which is sensitive to the far IR band. The IR radiation to be detected shines in backwards through the rear side of the Si substrate 1 and penetrates through the silicon to a metal layer 2. Charge carriers, which are generated by the radiation in the metal layer 2 and which have an energy which is greater than the barrier level $\phi$, can cross over the barrier 3 into the space charge zone 4 into the silicon layer 1. The charge carriers which thus have been freed may be drawn out through electrical leads 5 and 6, whereby their presence may be proved. One lead 5 is conventionally connected to the metal layer 2. The other lead 6 is conventionally connected to an electrode 6' on the back of the silicon substrate 1.

Figure 2:
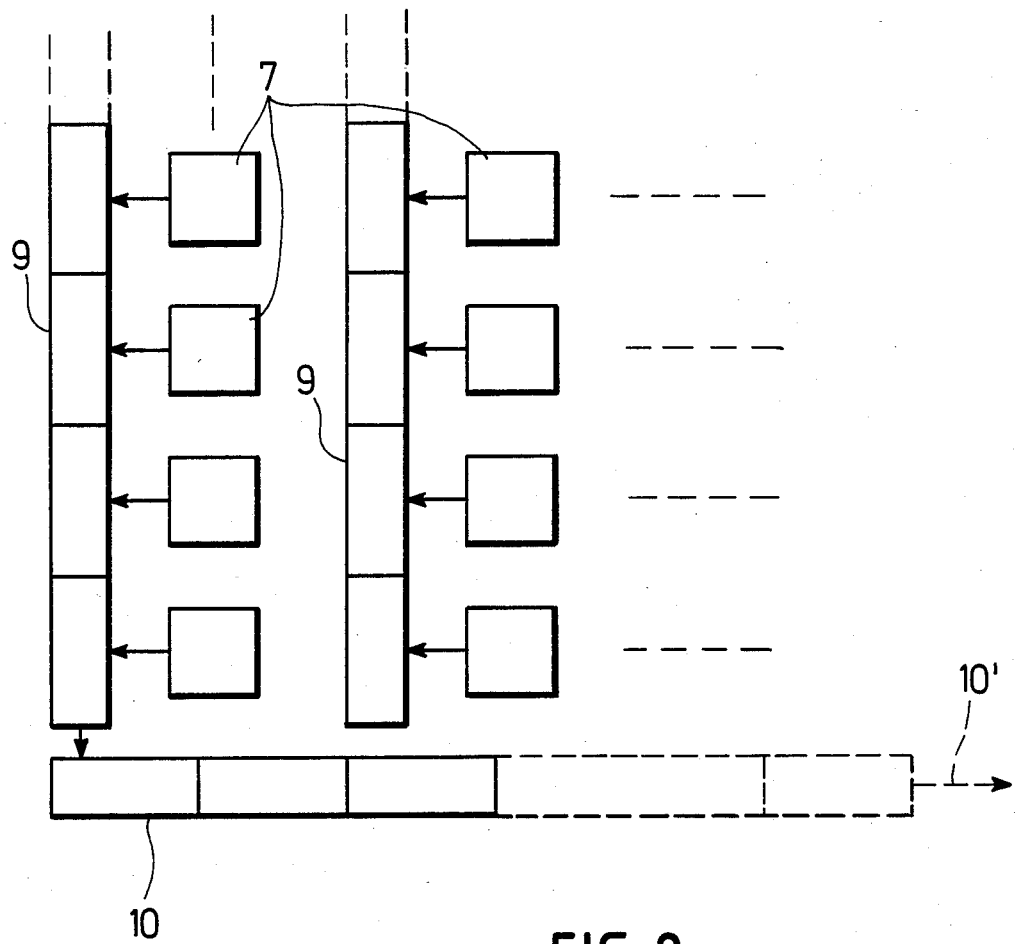
FIG. 2 illustrates schematically a plurality of elements according to FIG. 1 in a row or array.

FIG. 2 shows a front view of an array of elements 7, one of which is shown in FIG. 1 including shift registers 9 and 10 (CCD's). Elements 7 and shift registers 9,10 are implemented in Si-technology. Electrical charge produced is the detector elements 9 by IR light is transfered by means of vertical and horizontal shift registers 9,10 to a video output 10'.

Figure 3:
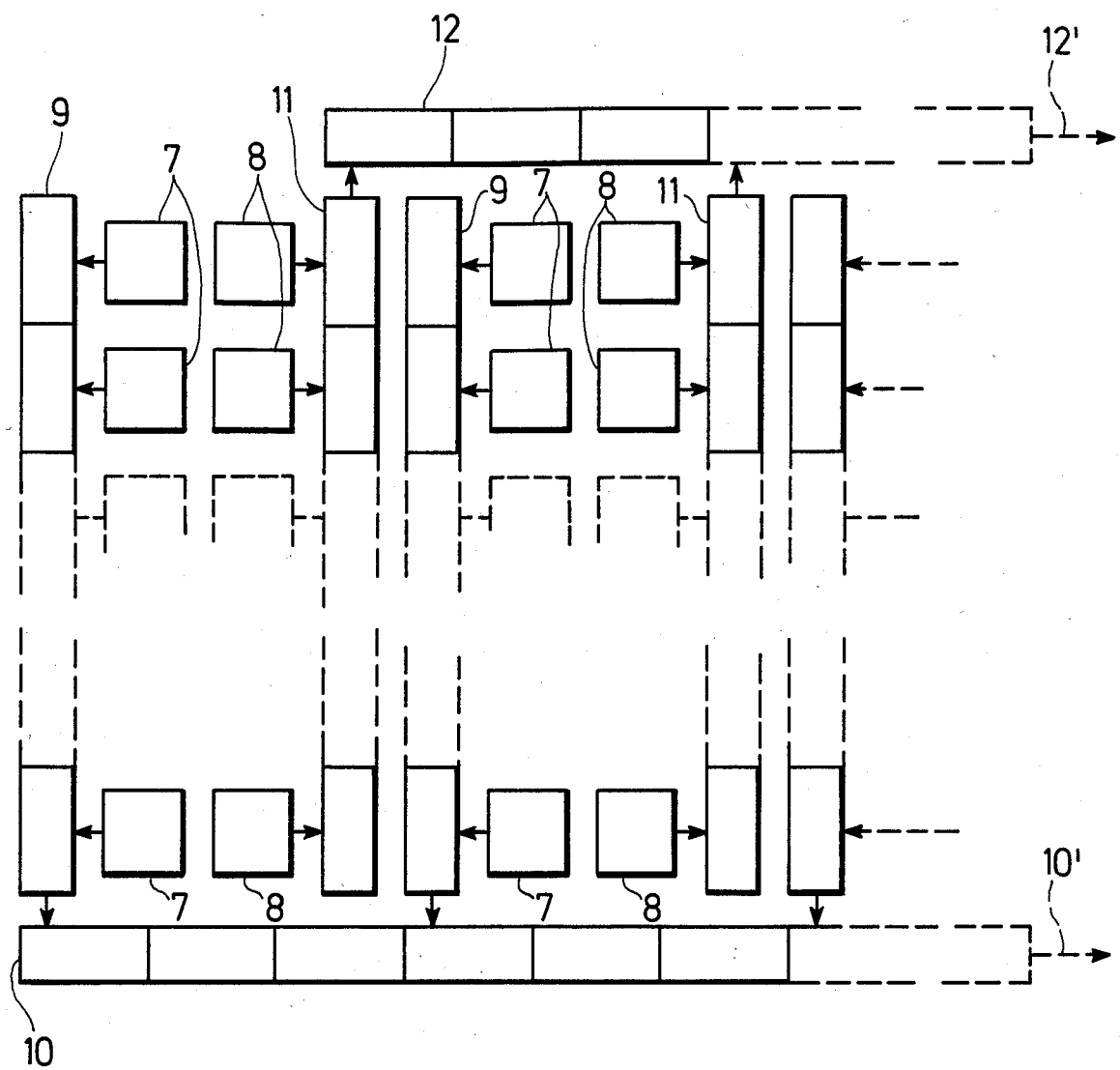
FIG. 3 is a view similar to that of FIG. 2, wherein elements according to the invention alternate with conventional detector elements.

FIG. 3 shows a front view of an array of elements 7 alternating with other conventional detector elements 8.

The detector elements 7 are constructed as disclosed herein for detecting IR radiation in the band between 8–12 μm. Additionally, the elements 8 are Schottky-barrier elements which are sensitive to IR radiation from 3–5 μm. Electrical charge produced by the 8–12 μm IR band in the detector elements 7 is transfered by means of vertical and horizontal shift registers 9 and 10 to video output 10', whereas for the 3–5 μm IR band the corresponding process occurs with detector elements 8, vertical and horizontal shift registers 11, 12 to video output 12'. By these means, pictures in different IR bands may be obtained simultaneously from the same silicon ship. The combination of IR detectors in one of the mentioned bands with detectors of, for instance, the intrinsic np-type, which are sensitive in the visible and near IR, or the combination of all three detector types in the same silicon chip is also possible.

Although the invention has been described with reference to specific example embodiments, it will be appreciated, that it is intended to cover all modifications and equivalents within the scope of the appended claims.

What is claimed is:

1. An opto-electrical apparatus for detecting infrared light, comprising a Schottky-barrier device including at least one detector element including a substrate (1) of p-type silicon, a metal layer (2) having a given work function on one surface of said p-type silicon substrate (1), and a p+-silicon doped intermediate barrier (3) between said p-type silicon substrate (1) and said metal layer (2), said intermediate barrier (3) having a doping density or concentration within the range of $5 \times 10^{18}$ to $5 \times 10^{19}$ atoms per cm$^3$ and a thickness (d) within the range of 50 to 200 Angstroems, said intermediate barrier further having a barrier height $\phi = 0.10$ to 0.15 eV, whereby the device is capable of detecting infrared radiation in the range of about 8 to 12 microns.

2. The device of claim 1, wherein said metal layer (2) is platinum in the form of PtSi resulting from annealing or tempering the platinum layer in the temperature range of 350° C. to 500° C. for a time sufficient to partially alloy the platinum into the p+-silicon doped intermediate barrier (3).

3. The device of claim 1, wherein a plurality of said detector elements are arranged in an array.

4. The device of claim 1, comprising further detector elements sensitive in a radiation range other than said range of 8 to 12 microns of said first mentioned detector elements, said further detector elements and said first mentioned detector elements being arranged on the same Si chip to form at least one array, and being read out separately.

5. The device of claim 4, wherein said other detector elements have a sensitivity in the infrared range of 3 to 5 microns.

6. The device of claim 4, wherein said other detector elements have a sensitivity in the visible light range.

* * * * *